US008363453B2

(12) United States Patent
Arsovski et al.

(10) Patent No.: US 8,363,453 B2
(45) Date of Patent: Jan. 29, 2013

(54) STATIC RANDOM ACCESS MEMORY (SRAM) WRITE ASSIST CIRCUIT WITH LEAKAGE SUPPRESSION AND LEVEL CONTROL

(75) Inventors: Igor Arsovski, Williston, VT (US); Harold Pilo, Underhill, VT (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 12/959,883

(22) Filed: Dec. 3, 2010

(65) Prior Publication Data

US 2012/0140551 A1 Jun. 7, 2012

(51) Int. Cl.
*G11C 11/00* (2006.01)
(52) U.S. Cl. .................... 365/154; 365/203; 365/189.11
(58) Field of Classification Search .................. 365/154, 365/203, 189.11, 226, 149, 189.05, 189.17, 365/230.06, 185.13, 185.17
See application file for complete search history.

(56) References Cited

U.S. PATENT DOCUMENTS

| 4,954,731 | A | * | 9/1990 | Dhong et al. ................... 326/97 |
|---|---|---|---|---|
| 6,826,074 | B2 | | 11/2004 | Yamauchi |
| 6,865,119 | B2 | | 3/2005 | Becker |
| 7,468,903 | B2 | | 12/2008 | Wang et al. |
| 7,586,787 | B2 | | 9/2009 | Vo et al. |
| 7,643,357 | B2 | | 1/2010 | Braceras et al. |
| 7,672,175 | B2 | | 3/2010 | Yoon et al. |
| 7,692,964 | B1 | | 4/2010 | Sabharwal et al. |
| 7,738,283 | B2 | | 6/2010 | Wong |
| 7,760,575 | B2 | | 7/2010 | Tooher et al. |
| 2009/0235171 | A1 | * | 9/2009 | Adams et al. ................. 715/723 |
| 2010/0097844 | A1 | | 4/2010 | Liu |
| 2010/0232244 | A1 | * | 9/2010 | Hirabayashi ................. 365/208 |

FOREIGN PATENT DOCUMENTS

JP 2000242346 A 9/2000

* cited by examiner

*Primary Examiner* — Dang Nguyen
(74) *Attorney, Agent, or Firm* — David A. Cain; Hoffman Warnick LLC

(57) ABSTRACT

A static random access memory (SRAM) write assist circuit with leakage suppression and level control is described. In one embodiment, the SRAM write assist circuit increases the amount of boost provided in a write cycle, while in another embodiment, the SRAM write assist circuit limits the amount of boost provided at higher supply voltages.

20 Claims, 9 Drawing Sheets

STATIC RANDOM ACCESS MEMORY (SRAM) WRITE ASSIST CIRCUIT WITH LEAKAGE SUPPRESSION AND LEVEL CONTROL

BACKGROUND

The present invention relates generally to integrated circuit memory devices, and more specifically to a static random access memory (SRAM) write assist circuit with leakage suppression and level control.

Memory devices are commonly employed as internal storage areas in a computer or other electronic equipment. One specific type of memory used to store data in a computer is random access memory (RAM). RAM is typically used as main memory in a computer environment, and is generally volatile in that once power is turned off, all data stored in the RAM is lost.

An SRAM is one example of a RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1"). One existing configuration for an SRAM cell includes a pair of cross-coupled devices such as inverters. The inverters act as a latch that stores the data bit therein, so long as power is supplied to the memory array. In a conventional six-transistor (6T) cell, a pair of access transistors or pass gates (when activated by a word line) selectively couples the inverters to a pair of complementary bit lines (i.e., a bit line true and bit line complementary). Other SRAM cell designs may include a different number of transistors (e.g., 4T, 8T, etc.).

The design of SRAM cells has traditionally involved a compromise between the read and write functions of the memory array to maintain cell stability, read performance and write performance. In particular, the transistors which make up the cross-coupled latch must be weak enough to be over-driven during a write operation, while also strong enough to maintain their data value when driving a bit line during a read operation. The access transistors that connect the cross-coupled inverters to the true and complement bit lines affect both the stability and performance of the cell. In one-port SRAM cells, a single pair of access transistors is conventionally used for both read and write access to the cell. The gates are driven to a digital value in order to switch the transistors between an "on" and "off" state. The optimization of an access for a write operation would drive the reduction of the on-resistance ($R_{on}$) for the device. On the other hand, the optimization of an access transistor for a read operation drives an increase in $R_{on}$ in order to isolate the cell from the bit line capacitance and prevent a cell disturbance.

This compromise between the read function and the write function for an SRAM becomes more of an issue as integrated circuits are scaled down in size. In particular, read and write margins of the SRAM cells, which measure how reliably the bits of the SRAM cells can be read from and written into, are reduced as the operation voltages of the integrated circuits are reduced with the down-scaling of the circuits. Reduced read and write margins may consequently cause errors in the respective read and write operations for the SRAM cells.

SUMMARY

In one embodiment, there is a device that comprises a memory array comprising a plurality of static random access memory (SRAM) cells arranged in rows and columns, a plurality of true bit lines each connected to a column of the memory array and a plurality of complement bit lines each forming a differential pair with, and in the same column as one of the plurality of true bit lines. The device further comprises a write assist circuit connected to each of the differential pair of bit lines in each of the plurality of SRAM cells of the memory array. The write assist circuit comprises a negative boost node; a discharge device coupled to ground and the negative boost node, the discharge device configured to receive a first control signal; a boost capacitor coupled to the negative boost node, the boost capacitor configured to receive a second control signal; a plurality of bit line control devices configured to control a write data line for writing a bit line in a write cycle, each of the plurality of bit line control devices comprising a transistor coupled to the negative boost node, wherein a gate-source terminal of each transistor of the plurality of bit line control devices is connected to the negative boost node; and a bit line control selection device coupled to the plurality of bit line control devices and the negative boost node, the bit line control selection device configured to select one of the plurality of bit line control devices during the write cycle, wherein the gate-source terminals of each of the transistors of the unselected plurality of bit line control devices receives negative voltage from the negative boost node and feeds the negative voltage to the gate to minimize leakage.

In a second embodiment, there is a static random access memory (SRAM) write assist circuit. In this embodiment, SRAM write assist circuit comprises: a negative boost node; a discharge device coupled to ground and the negative boost node, the discharge device configured to receive a first control signal; a boost capacitor coupled to the negative boost node, the boost capacitor configured to receive a second control signal; a plurality of bit line control devices configured to control a write data line for writing a bit line in a write cycle, each of the plurality of bit line control devices comprising a transistor coupled to the negative boost node, wherein a gate-source terminal of each transistor of the plurality of bit line control devices is connected to the negative boost node; and a bit line control selection device coupled to the plurality of bit line control devices and the negative boost node, the bit line control selection device configured to select one of the plurality of bit line control devices during the write cycle, wherein the gate-source terminals of each of the transistors of the unselected plurality of bit line control devices receives negative voltage from the negative boost node and feeds the negative voltage to the gate to minimize leakage.

DETAILED DESCRIPTION

Figure 1:
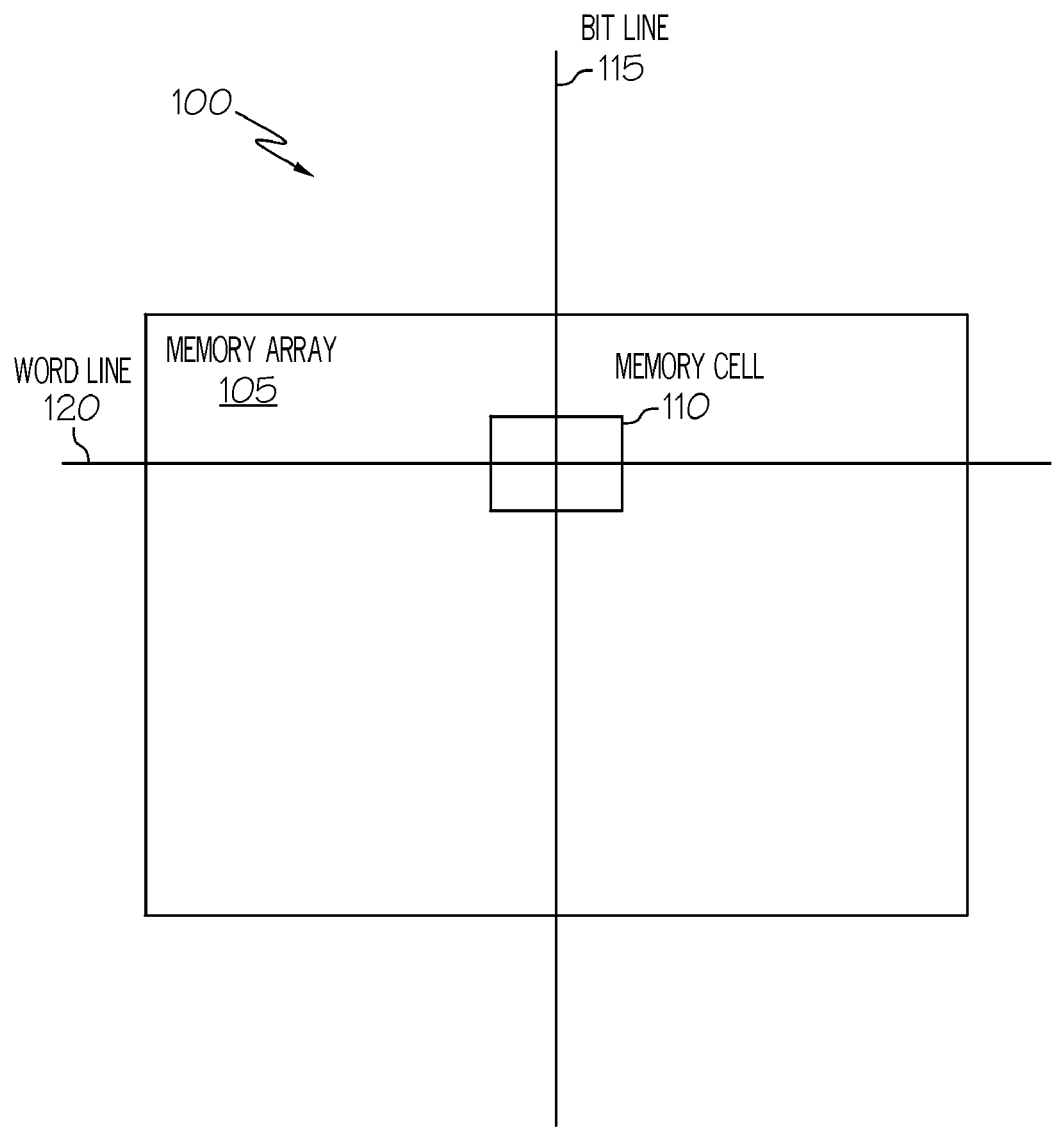
FIG. 1 shows a simplified block diagram of a memory array.

Referring to FIG. 1, there is a simplified block diagram of a memory 100. As shown in FIG. 1, memory 100 includes a memory array 105. Memory array 105 comprises memory cells, such as memory cell 110, in which bits are stored. For ease of illustration, FIG. 1 shows only memory cell 110, however, memory array 105 would have memory cells arranged in each of its rows and columns. In one embodiment, memory cell 110 is a static random access memory (SRAM). Although the description that follows for this figure and other figures is directed to an SRAM, those skilled in the art will recognize that embodiments described below are also suited for use with other memory devices such as a dynamic RAM (DRAM). A typical SRAM cell includes a balanced pair of cross-coupled inverters storing a single data bit. A pair of pass gates (a balanced pair of field-effect transistors (FETs)) selectively connects the complementary outputs of the cross-coupled inverters to a corresponding complementary or differential pair of bit lines (i.e., bit line true and bit line complement). A word line connected to the gates of the pass gate FETs selects the memory cell 110 to the corresponding complementary pair of bit lines for performing an operation that may include a read or a write operation. The SRAM cell may be formed from cell designs that may include any number of transistors (e.g., 4T, 6T, 8T, etc.).

FIG. 1 does not illustrate a particular SRAM cell design, however, this figure shows a bit line 115 (representing bit line true and bit line complement) connecting to memory cell 110 through a column of memory array 105 and a word line 120 connecting to memory cell 110 through a row of memory array 105. As an example, an N row by M column SRAM array would be organized as N word lines by M column bit lines. In operation, the bit line pairs (i.e., bit line true and bit line complement) represented by bit line 115, are in standby and are clamped together to a supply or reference voltage. Accessing bit line 115 for a read or a write operation from memory array 105 entails driving one of the N word lines, i.e., turning on the pass gates for all memory cells 110 on that word line. With the pass gates on for that selected word line, the cross-coupled cell inverters are coupled to the corresponding bit line pairs, partially selecting the cells on that word line. Selection of one of the M columns selects the cells on that word line, with the bit lines of a particular cell actually being accessed. The remaining bit lines of the other cells in the column remain half selected during the access.

Figure 2:
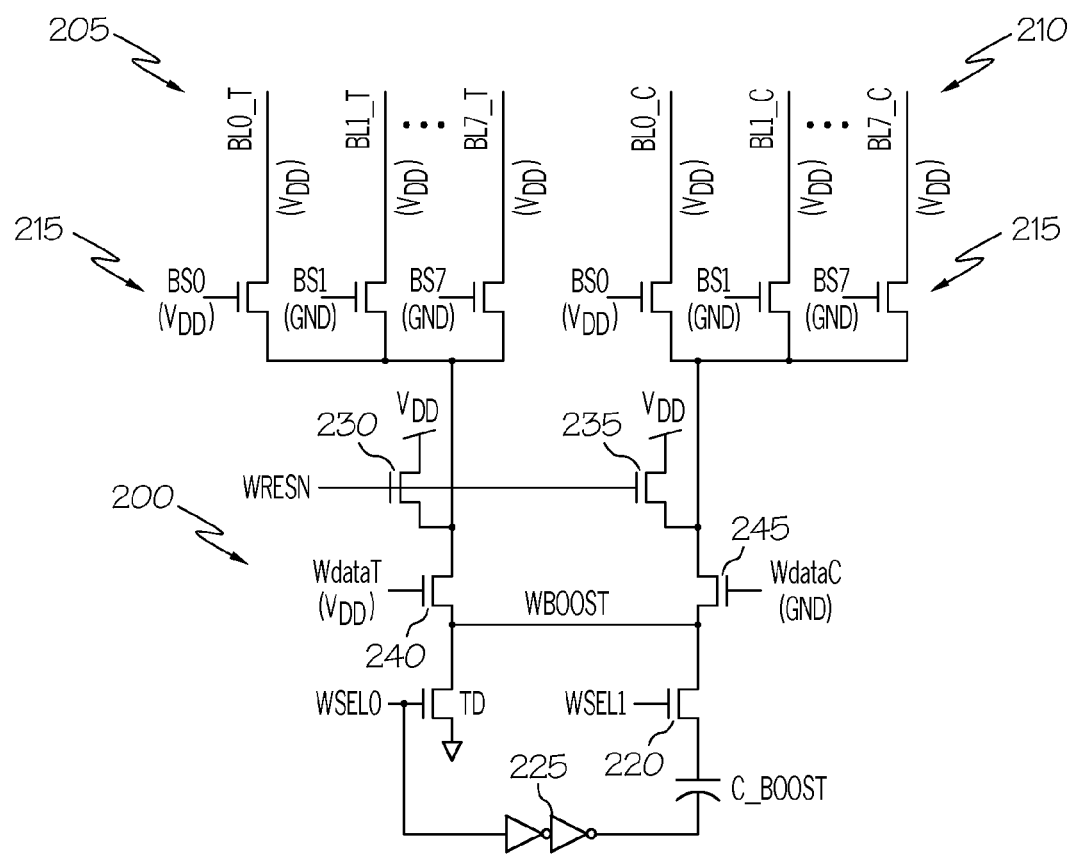
FIG. 2 shows a conventional static random access memory (SRAM) write driver.

Those skilled in the art will recognize that memory cell 110 may include other elements than what is illustrated in FIG. 1. For example, memory cell 110 may include a sense amplifier for facilitating read operations and a write driver for facilitating write operations. FIG. 2 shows a conventional SRAM write driver 200 that may be implemented in memory cell 110 of FIG. 1. In FIG. 2, SRAM write driver 200 is coupled to bit line true 205 and bit line complement 210 via bit switches 215. As shown in FIG. 2, bit line true 205 is formed from eight true bit lines (BL0_T, BL1_T, BL2_T, BL3_T, BL4_T, BL5_T, BL6_T and BL7_T) and bit line complement 210 is formed from eight complement bit lines (BL0_C, BL1_C, BL2_C, BL3_C, BL4_C, BL5_C, BL6_C and BL7_C). Bit switches 215, which are used to connect one of the bit lines 205, 210 to SRAM write driver 200, are formed from N-type field effect transistors (NFETs) with gates connected to BS0, BS1, BS2, BS3, BS4, BS5, BS6 and BS7 for bit line true 205 and similar NFETs with gates connected to BS0, BS1, BS2, BS3, BS4, BS5, BS6 and BS7 for bit line complement 210. Note that cross-coupled inverters described above for an SRAM cell would be coupled to each of the bit lines.

In a typical write operation, after a particular word line has been activated, one of the bit lines (e.g., bit line true) is brought to ground (GND), while the other bit line (e.g., bit line complement) is maintained at a supply voltage (VDD). This discharges the cell and facilitates a write to the cell. In particular, this enables the "1" side (e.g., bit line true) to change to a "0", allowing the cell to flip states. A discharge device TD (an NFET) and a boost capacitor C_BOOST are used to discharge one of the bit lines 205 and 210. As shown in FIG. 2, capacitor C_BOOST is coupled to discharge device TD at a node WBOOST via an NFET 220. The gate of discharge device TD, which is controlled by signal WSEL0, is coupled to capacitor C_BOOST via a pair of serially connected inverters 225. Discharge device TD and capacitor C_BOOST are connected to bit switches 215, bit line true 205 and bit line complement 210 via NFETs 240 and 245 which are controlled by data signals WdataT and WdataC, respectively.

Figure 3:
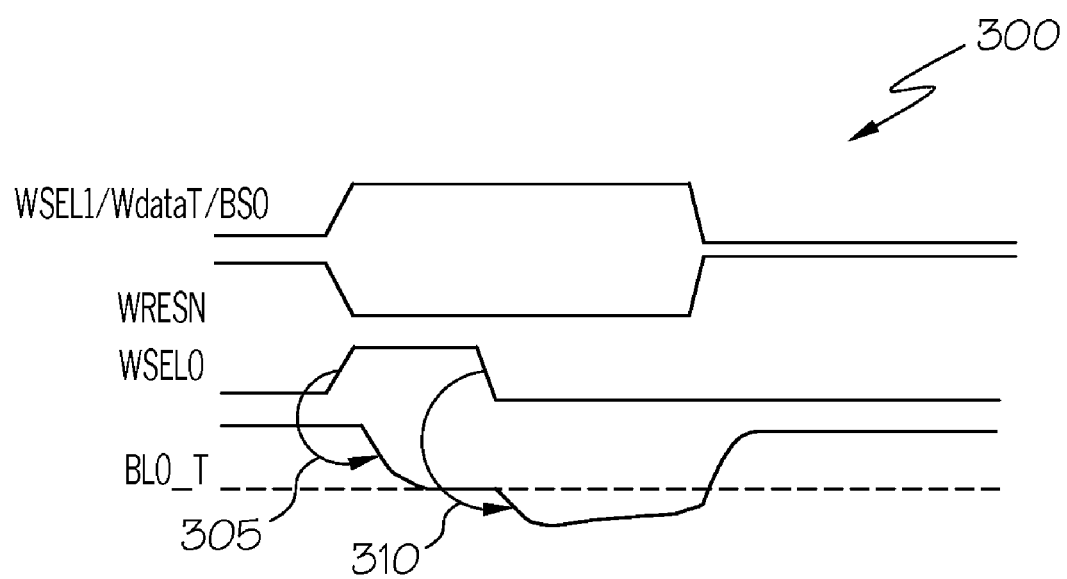
FIG. 3 shows a circuit timing diagram that describes the operation of the SRAM write driver depicted in FIG. 2.

FIG. 3 shows a circuit timing diagram 300 that describes the operation of SRAM write driver 200 for a write operation. In the example illustrated in FIGS. 2 and 3, bit line BL0_T is brought from VDD to GND, while the other bit lines are maintained at VDD. As shown in FIG. 3, signal WRESN is high, while signals WSEL1, WdataT and BS0 are low. This causes NFETS 230 and 235 to be turned on, while NFET 220, NFET 245 and bit switch BS0 are off. In addition, at this time, discharge device TD is off because data signal WSEL0 is low. As data signal WRESN goes low at 305 (FIG. 3) and data signals WSEL0, WSEL1, WdataT and BS0 go high, NFETS 230 and 235 turn off, while discharge device TD, NFET 220, NFET 240 and bit switch BS0 turn on. This results in node WBOOST discharging to GND through discharge device TD, which causes BL0_T to discharge to GND (305 of FIG. 3). When data signal WSEL0 goes low at 310 (FIG. 3), discharge device TD turns off, then inverters 225 cause capacitor C_BOOST to discharge through node WBOOST. This charge is transferred over to bit line BL0_T which causes it to be boosted below GND (310 of FIG. 3). In essence, bringing bit line BL0_T below GND provides an overdrive improvement to the path gates utilized in the memory cell and an improvement in write margins. Eventually, the write cycle continues with signals WSEL1, WdataT and bit switch BS0 going low as signal WRESN goes high, causing BL0_T to return to VDD.

There are several drawbacks associated with the SRAM write driver 200. One drawback occurs when the WBOOST node is brought below GND. Ideally, when the WBOOST node is brought below GND, it is desirable to have all of the negative charge flow through the bit line that has been selected. In the configuration of FIG. 2, it has been determined that the charge gets depleted by additional transistors that are in the path of the selected bit line. For example, consider NFET 245 in FIG. 2, which has its gate connected to signal WdataC, which is at GND. When the WBOOST node transitions below GND, NFET 245 will turn on because a positive voltage threshold VGS develops from the gate voltage being at GND and the WBOOST node being below GND. Similar effects occur at NFETS 230, 235 and bit switches BS1 through BS7 in the bit line complement side 210, causing these transistors to turn on. Consequently, the WBOOST node will flow towards these paths in addition to the path for the selected bit line path (BL0_T). This means that the amount of boost below GND provided to BL0_T is limited by the turning on of the unselected transistors NFETs 230, 235, 245 and switches BS1 through BS7 (bit line complement side 210).

Another drawback of the SRAM write driver 200 of FIG. 2 occurs when signal WSEL0 turns on discharge device TD to initialize bringing bit line BL0_T to GND. As mentioned above, turning on discharge device TD brings the WBOOST node to GND, which causes bit line BL0_T to go to GND. In the configuration of FIG. 2, it has been determined that during the time that the WBOOST node is brought to GND by discharge device TD, the boost terminal of capacitor C_BOOST is getting charged by signal WSEL0. Consequently, capacitor C_BOOST wants to put this charge back on the WBOOST node. Because this charge being provided on the WBOOST node has to be depleted by the discharge device TD, the discharge of the WBOOST node and bit line BL0_T is slowed down, which slows the write time.

A third drawback of the SRAM write driver 200 of FIG. 2 occurs during instances of supply voltage (VDD) increases. In particular, supply voltage increases causes large voltages across the drain and source (VDS) of transistors in the path of the selected bit line to increase as well. It has been determined that the gate oxides of these transistors are adversely affected when the negative boost voltage is brought below GND during these instances of higher supply voltages, compromising the reliability of the gate oxides.

Figure 4:
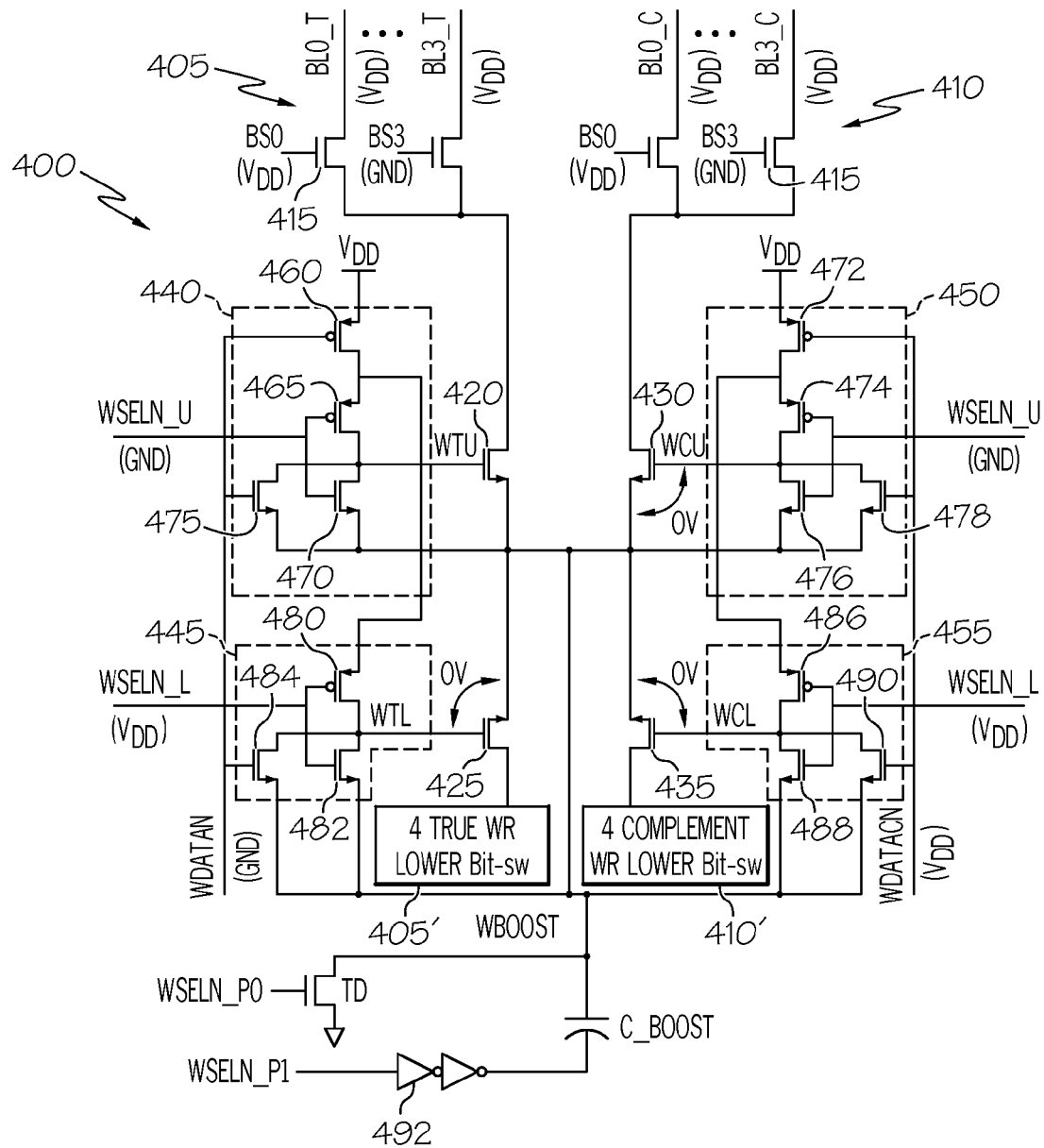
FIG. 4 shows an SRAM write assist circuit according to one embodiment of the present invention.

FIG. 4 shows an SRAM write assist circuit 400 according to one embodiment of the present invention that addresses the drawbacks associated with the SRAM writer driver circuit 200 of FIG. 2. In one embodiment, the eight true bit lines are arranged to have four true bit lines (BL0_T, BL1_T, BL2_T, BL3_T) located in an upper position with respect to the remaining four true bit lines (BL4_T, BL5_T, BL6_T and BL7_T) located in a lower position. Similarly, the eight complement bit lines are arranged to have four complement bit lines (BL0_C, BL1_C, BL2_C, BL3_C) located in an upper position with respect to the remaining four complement bit lines (BL4_C, BL5_C, BL6_C and BL7_C) located in a lower position. In FIG. 4, SRAM write assist circuit 400 is coupled to a bit line true 405, 405' and a bit line complement 410, 410' via bit switches 415. Bit line true 405 is formed from bit lines BL0_T, BL1_T, BL2_T, BL3_T, while bit line true 405' is formed from BL4_T, BL5_T, BL6_T, BL7_T, while bit line complement 410 is formed from bit lines (BL0_C, BL1_C, BL2_C, BL3_C, and bit line complement 410' is formed from bit lines BL4_C, BL5_C, BL6_C and BL7_C. Note that for ease of illustrating SRAM write assist circuit 400, true bit lines 405' (BL4_T, BL5_T, BL6_T and BL7_T) and complement bit lines 410' (BL4_C, BL5_C, BL6_C and BL7_C) are respectively located below true bit lines 405 (BL0_T, BL1_T, BL2_T, BL3_T) and complement bit lines 410 (BL4_C, BL5_C, BL6_C and BL7_C). As shown in FIG. 4, true bit lines 405 and 405' are separated by NFETs 420 and 425, while complement bit lines 410 and 410' are separated by NFETs 430 and 435.

Bit switches 415 connect one of the bit lines 405, 405', 410 and 410' to NFETs 420, 425, 430 and 435. Note that although FIG. 4 does not show bit switches associated with true bit lines 405' and complement bit lines 410', those skilled in the art will recognize that these bit lines would have bit switches BS4, BS5, BS6 and BS7 to respectively connect true bit lines and complement bit lines to NFETs 425 and 435.

As used herein, NFETs 420, 425, 430 and 435 are referred to as bit line control devices because as explained below each is configured to control a write data line for writing a bit line in a write cycle. FIG. 4 shows that NFETs 420, 425, 430 and 435 are coupled to boost node WBOOST (negative boost node) via its sources. As shown in FIG. 4, the gates of NFETs 420, 425, 430 and 435 respectively receive a signal WTU, WTL, WCU and WCL. In one embodiment, signals WTU, WTL, WCU and WCL are used to decide where the charge provided by the WBOOST node goes. In particular, as will be explained below, only one of the signals WTU, WTL, WCU and WCL will be active at a time, causing only one of NFETs 420, 425, 430 and 435 to be active. That is, whichever gate and respective bit line control device (i.e., NFETs 420, 425, 430 and 435) is active, is the path that will be taken by the charge, as the WBOOST node is boosted below GND. Instead of having the charge be divided or wasted in the unselected transistors (NFETS 230, 235, 245 and switches BS1, BS7 and BS0 (bit line complement side 210)) of SRAM write driver 200 of FIG. 2, the charge in the embodiment shown in FIG. 4 is directed towards only one of the bit line control device (i.e., NFETs 420, 425, 430 and 435) by selecting that particular transistor during a write cycle.

As shown in FIG. 4, bit line control selection devices 440, 445, 450, 455 are respectively coupled to bit line control devices NFETs 420, 425, 430 and 435 via signals WTU, WTL, WCU and WCL. Bit line control devices NFETs 420, 425, 430 and 435 are made active by applying supply voltage VDD to WTU, WTL, WCU and WCL. FIG. 4, shows that bit line control selection device 440 comprises p-type FETs (PFETS) 460 and 465 and NFETs 470, 475. As shown in FIG. 4, the source of PFET 460 is coupled to VDD, its gate is controlled by a signal WDATATN, and its drain is coupled to the source of PFET 465. The gate of PFET 465 is coupled to the gate of NFET 470, which are both controlled by signal WSELN_U. The drain of PFET 465 is coupled to the drain of NFET 470 and the drain of NFET 475. The source of NFET 470 is coupled to the node WBOOST, as is the source of NFET 475. As shown in FIG. 4, signal WTU provided to the gate of NFET 420 is provided from the drain of NFET 475, whose gate is controlled by signal WDATATN. Bit line control selection device 450 is a mirror of bit line control selection device 440, except that PFET 472 and NFET 478 are controlled by signal WDATACN instead of signal WDATATN.

FIG. 4, shows that bit line control selection device 445 comprises PFET 480 and NFET 482. As shown in FIG. 4, the source of PFET 480 is coupled to the connection of the drain of PFET 460 and the source of PFET 465. The gate of PFET 480 is coupled to the gate of NFET 482, which are both controlled by signal WSELN_L. The drain of PFET 480 is coupled to the drain of NFET 482 and the drain of NFET 484. The source of NFET 482 is coupled to the node WBOOST, as is the source of NFET 484. As shown in FIG. 4, signal WTL provided to the gate of NFET 425 is provided from the drain of NFET 484, whose gate is controlled by signal WDATATN. Bit line control selection device 455 is a mirror of bit line control selection device 445, except that NFET 490 is controlled by signal WDATACN instead of signal WDATATN.

In this configuration, in addition to each of the bit line control devices NFETS 420, 425, 430 and 435 coupled to the negative boost node WBOOST through their sources, each of bit line control selection device 440, 445, 450 and 455 are respectively coupled to WBOOST node through the sources of NFETs 470, 475; 476, 478; 482, 484; and 488, 490. In this configuration, a gate-source terminal of NFETs 470, 475, 476, 478, 482, 484, 488, and 490 is connected to the WBOOST node. Therefore, each of the transistors of the bit line control devices NFETs 420, 425, 430 and 435 that are not selected for the write cycle will not be activated and will dissipate charge from the WBOOST node. The gate-source terminals of each of the transistors will be shorted because each is receiving a negative voltage from the WBOOST node and feeding it to its respective gate to minimize leakage.

FIG. 4 further shows that SRAM write assist circuit 400 comprises an NFET discharge device TD and a boost capacitor C_BOOST that are used to discharge bit lines 405, 405', 410 and 410'. As shown in FIG. 4, capacitor C_BOOST is coupled to discharge device TD at node WBOOST. In the embodiment of FIG. 4, the gate of discharge device TD is controlled by signal WSELN_P0, while capacitor C_BOOST and a pair of serially connected inverters 492 are separately controlled by signal WSELN_P1. This configuration allows discharge device TD and capacitor C_BOOST to be controlled separately and independently from each other, which is not the case with SRAM write driver 200 of FIG. 2.

Figure 5:
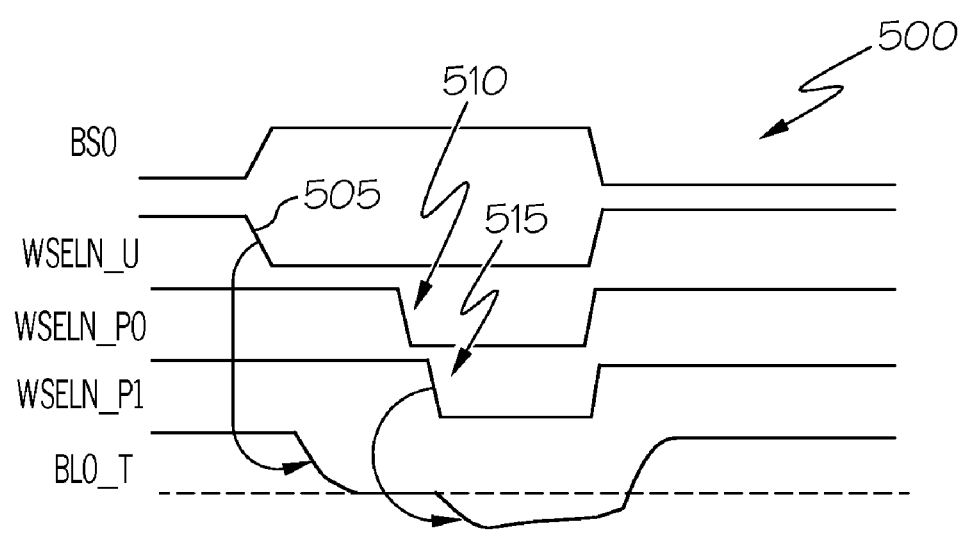
FIG. 5 shows a circuit timing diagram that describes the operation of the SRAM write assist circuit depicted in FIG. 4 according to one embodiment of the present invention.

FIG. 5 shows a circuit timing diagram 500 that describes the operation of SRAM write assist circuit 400 for a write operation utilizing bit line BL0_T via bit line control device NFET 420 and bit line control selection device 440, while bit line control devices NFETs 425, 430 and 435 are unselected (i.e., that is not activated by bit line control selection devices 445, 450 and 455). In the example illustrated in FIGS. 4 and 5, bit line BL0_T is brought from VDD to GND, while the other bit lines are maintained at VDD. As shown in FIG. 5, signals WSELN_U, WSELN_P0, WSELN_P1 and bit line BL0_T are initially high, while bit switch BS0 is low. When bit switch BS0 is low, this transistor is not activated. Bit switch BS0 is activated when signal BS0 goes high. At this time signal WSELN_U goes to GND, as does signal WDATATN (not illustrated in FIG. 5). Signal WDATACN remains at VDD (not illustrated in FIG. 5). When signals WSELN_U and WDATATN go to GND and WDATACN remains at VDD, this signifies that SRAM write assist circuit 400 is going to write a "1" via bit line control device NFET 420 and bit line control selection device 440, because supply voltage VDD is brought to the gate of NFET 420 via signal WTU. Because signals WSELN_U and WDATATN are at GND, bit line control device 425 is not activated by bit line control selection device 445. Similarly, because signal WSELN_U is at GND and signal WDATACN is at VDD, bit line control devices 430 and 435 are not activated by bit line control selection devices 450 and 455, respectively. Bit line control devices 430 and 435 will not be inadvertently turned on as is the case with the SRAM write driver 200 of FIG. 2, because the gate-source terminals of these devices, as well as their respective bit line control selection devices, are coupled to negative node WBOOST. Because these gates of these transistors are shorted to the negative WBOOST node, these devices will not turn on and provide a path for the charge from the WBOOST node to leak to. Essentially, the unselected paths provided by bit line control device NFETs 425, 430, 435 and their respective bit line control selection devices 445, 450 and 455 are equalized together and become unconductive, decreasing the possibility of leakage therethrough.

Referring to FIG. 5, timing diagram 500 shows at 505, as signal WSELN_U goes low, bit line BL0_T starts to discharge towards GND. This happens because discharge device TD is activated by having signal WSELN_P0 at high. When WSELN_P0 goes low at 510, discharge device TD turns off, and then signal WSELN_P1 goes low at 515. When signal WSELN_P1 goes low, inverters 492 cause capacitor C_BOOST to discharge and provide a boost below GND to bit line BL0_T. As mentioned above, because node WBOOST is coupled to the source of the bit line control devices (NFETS 420, 425, 430 and 435), then this boost below GND is provided to these devices. However, because the sources of their respective bit line control selection devices 445, 450 and 455 will be shorted to their gates, keeping these devices off and not providing a path for the charge from node WBOOST to leak towards. The path for the charge of the boost is to go towards bit line control device NFET 420 and bit line BL0_T via bit switch BS0. Thus, the amount of boost below GND is maximized by only enabling the paths provided by bit line control device NFET 420 and bit line control selection device 440, while shutting off the paths provided by bit line control device NFETs 425, 430, 435 and their respective bit line control selection devices 445, 450 and 455.

In addition to equalizing the gate-source terminals of the unselected bit line control devices NFETs 425, 430, 435 and their respective bit line control selection devices 445, 450 and 455 to decrease leakage in the SRAM write assist circuit 400, this configuration provides the added benefit of having the capacitor C_BOOST charged during a pre-charge phase of the write cycle. As shown in FIG. 5, the boost terminal of capacitor C_BOOST is charged up when signal WSELN_P1 goes high and discharged when this signal goes low. This feature is advantageous compared to the embodiment depicted in FIG. 2, because the write cycle of the bit lines of the embodiment of FIG. 4 can be quickly discharged to GND because capacitor C_BOOST has already been charged to VDD. There is no need to charge up the capacitor C_BOOST during the active phase of the write cycle like in the SRAM write driver 200 of FIG. 2.

Figure 6:
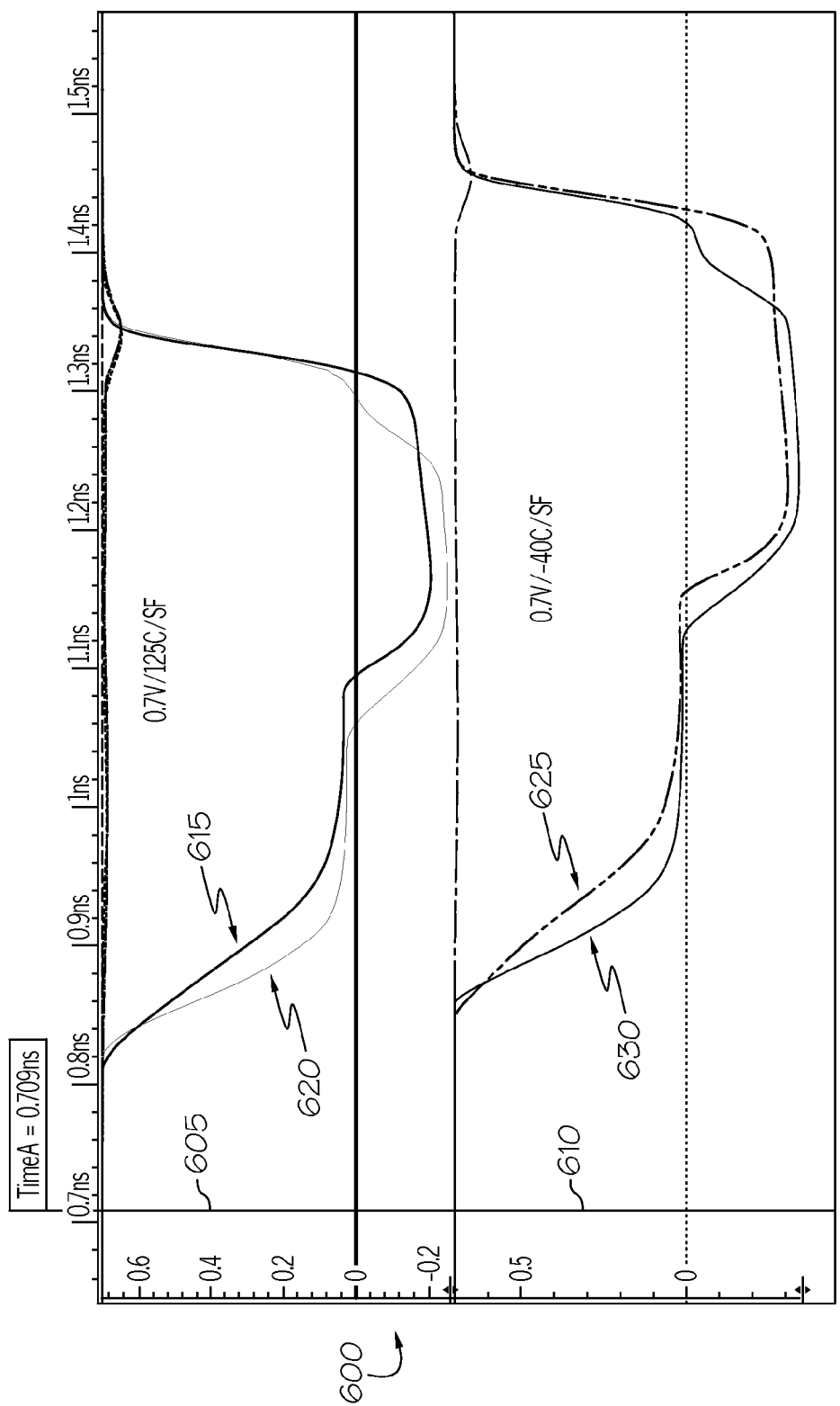
FIG. 6 shows a simulation of bit line discharges using the SRAM write assist circuit depicted in FIG. 4.

FIG. 6 shows a simulation 600 of the discharge of a bit line with the SRAM write assist circuit 400 depicted in FIG. 4 as compared to the discharge of a bit line with the SRAM write driver 200 of FIG. 2. In particular, FIG. 6 shows two waveform sets 605 and 610. Waveform set 605 shows the discharge of a bit line with the SRAM write assist circuit 400 depicted in FIG. 4 and the SRAM write driver 200 of FIG. 2 at 0.7 volts, at 125 degrees Celsius, under a slow fast (SF) corner, while waveform set 610 shows the operation of the SRAM write assist circuit 400 and the operation of the SRAM write driver 200 at 0.7 volts, minus 40 degrees Celsius, under a SF corner. In waveform set 605, the discharge of a bit line with the SRAM write driver 200 of FIG. 2 is depicted by reference element 615, while the discharge of a bit line with the SRAM write assist circuit 400 of FIG. 4 is depicted by reference element 620. Similarly, in waveform set 610, the discharge of a bit line with the SRAM write driver 200 of FIG. 2 is depicted by reference element 625, while the discharge of a bit line with the SRAM write assist circuit 400 of FIG. 4 is depicted by reference element 630. Both waveform sets 605 and 610 show that the discharge of a bit line via the SRAM write assist circuit 400 depicted in FIG. 4 occurs much faster than the discharge of a bit line via the SRAM write driver 200 depicted in FIG. 2. The faster rate of discharge of a bit line for the SRAM write assist circuit 400 can be attributed to the separate and independent control of the discharge device TD and capacitor C_BOOST. Because the SRAM write driver 200 of FIG. 2 is simultaneously using the discharge device TD to bring node WBOOST to GND and to charge capacitor C_BOOST, the rate of discharge is slower in this embodiment.

Waveform sets 605 and 610 of FIG. 6 further show that the boost below GND is different for SRAM write assist circuit 400 of FIG. 4 as compared to the SRAM write driver 200 of FIG. 2. In particular, both waveform sets 605 and 610 show that the boost below GND provided by the SRAM write assist circuit 400 of FIG. 4 is more than the boost provided by the SRAM write driver 200 of FIG. 2, making it more effective in writing a value to the memory cell.

Figure 7:
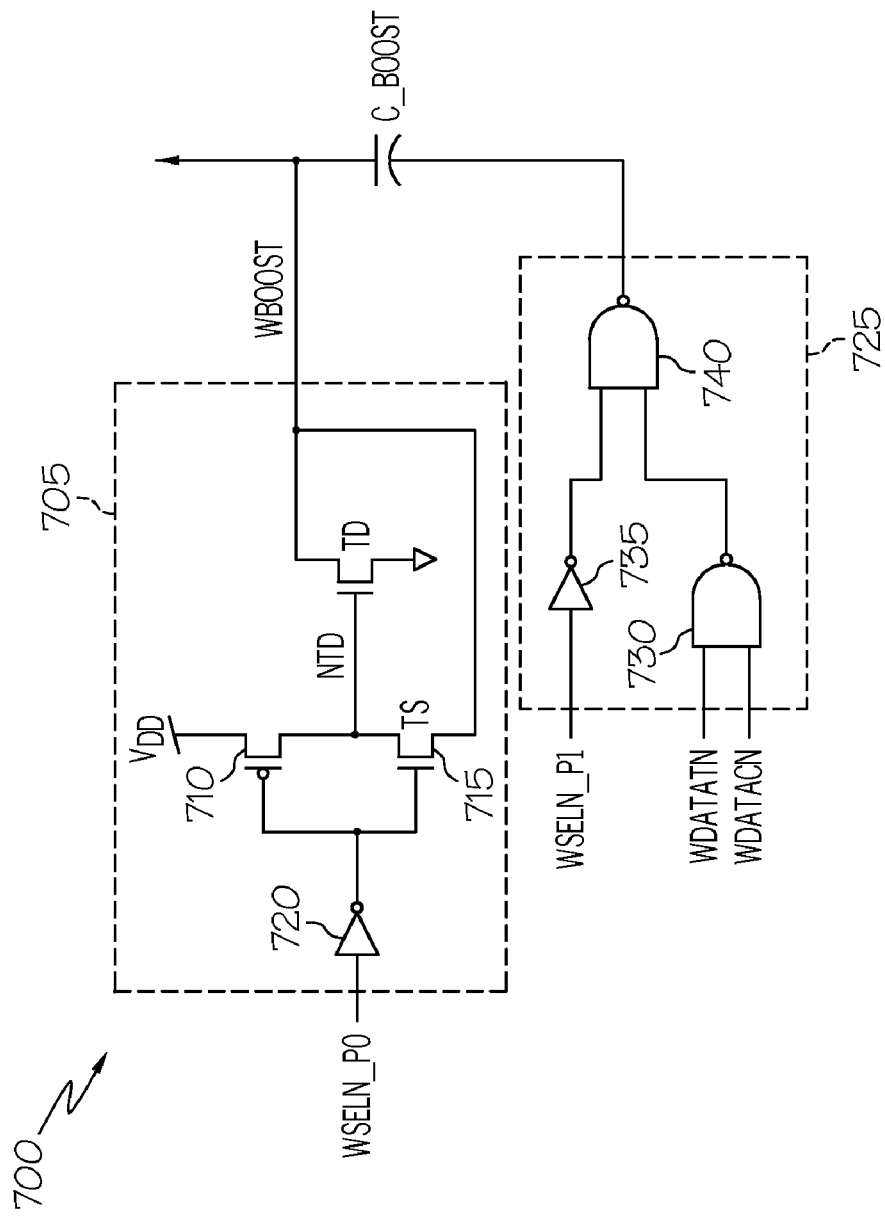
FIG. 7 shows additional circuitry that may be added to the SRAM write assist circuit depicted in FIG. 4 to maximize boost and write performance according to another embodiment of the present invention.

FIG. 7 shows additional circuitry 700 that may be added to SRAM write assist circuit 400 depicted in FIG. 4 and described by FIG. 5 to further maximize boost and write performance according to another embodiment of the present invention. Because circuitry 700 is coupled to discharge device TD and capacitor C_Boost, other elements associated with SRAM write assist circuit 400, and bit lines 405, 405', 410 and 410' and bit switches 415 are not illustrated in FIG. 7, however, their operation would be the same as previously described. The embodiment shown in FIG. 7 further maximizes boost and write performance of SRAM write assist circuit 400 by eliminating any leakage of charge from the node WBOOST through the discharge device TD after it has shut off and the boost below GND is provided. Leakage through the discharge device TD may occur after it shuts down because its gate is at GND and the source has a source voltage from the node WBOOST that would be below GND (e.g., −300 mV). This results in discharge device TD having an increased gate-source voltage, causing it to start turning on and to start depleting the charge from the node WBOOST during the boost.

The additional circuitry 700 of FIG. 7 addresses the leakage of charge through discharge device TD by adding a leakage suppression device 705 coupled to the discharge device TD. Leakage suppression device 705 includes a PFET 710 coupled in series to an NFET 715 and an inverter 720 coupled to the gates of PFET 710 and NFET 715. As shown in FIG. 7, the source of PFET 710 is coupled to voltage supply VDD and its drain is coupled to the drain of NFET 715. In addition, the source of NFET 715 is coupled to the node WBOOST. FIG. 7 further shows that inverter 720 receives signal WSELN_P0 as an input, which causes PFET 710 and NFET 715 to provide signal NTD to the gate of discharge device TD. As explained below, signal NTD functions as a control signal to minimize leakage at the discharge device.

Circuitry 700 of FIG. 7 further includes a logic device 725 coupled to the capacitor C_BOOST. Logic device 725 includes a two input NAND gate 730 in parallel with an inverter 735, whose outputs are provided to a two input NAND gate 740. As shown in FIG. 7, inverter 735 receives signal WSELN_P1 as an input and NAND gate 730 receives signals WDATATN and WDATACN as input. As described above for FIG. 4, these signals are used in the control of the bit line control selection devices 440, 445, 450 and 455 (FIG. 4) and the bit line control devices 420, 425, 430 and 435 (FIG. 4). In one embodiment, logic device 725 is configured to block boosting of the capacitor C_BOOST for unselected write driver circuits.

In the configuration shown in FIG. 7, leakage suppression device 705 is able to eliminate leakage at discharge device TD because the source of NFET 715 is coupled to the node WBOOST, which enables signal NTD to be at below GND, causing discharge device TD to be completely off and not be turned on by an increased gate-source voltage. In particular, when signal WSELN_P0 goes low, discharge device TD is turned off to initiate the boost of node WBOOST below GND. Because WBOOST is below GND and NFET 715 is active when WSELN_P0 is low, signal NTD provides a below GND voltage to the gate of discharge device TD. As mentioned above, having its source and gate below GND guarantees that discharge device TD remains off during the boost, thereby preventing any leakage of charge from the WBOOST node through discharge device TD. This results in a more effective discharge of the bit line for the write cycle operation because a leakage path through discharge device TD is shut off, which allows more of the boost voltage to go solely to the bit line.

In operation, logic device 725 serves to ensure that when capacitor C_BOOST provides its below GND boost to node WBOOST, that other columns (paths formed by bit line control devices and bit line control selection devices) in the SRAM write assist circuit 400 (FIG. 4) that are not undergoing a write operation, do not get boosted below GND. In particular, signals WDATATN, WDATACN and logic gates 730 and 740, function to gate the boost control of capacitor C_BOOST provided by signal WSELN_P1 and inverter 735. This ensures that the columns that do not write do not get boosted below GND. This eliminates large boost potential across devices (e.g., bit line control devices and bit line control selection devices) in the SRAM write assist circuit 400 (FIG. 4).

Figure 8:
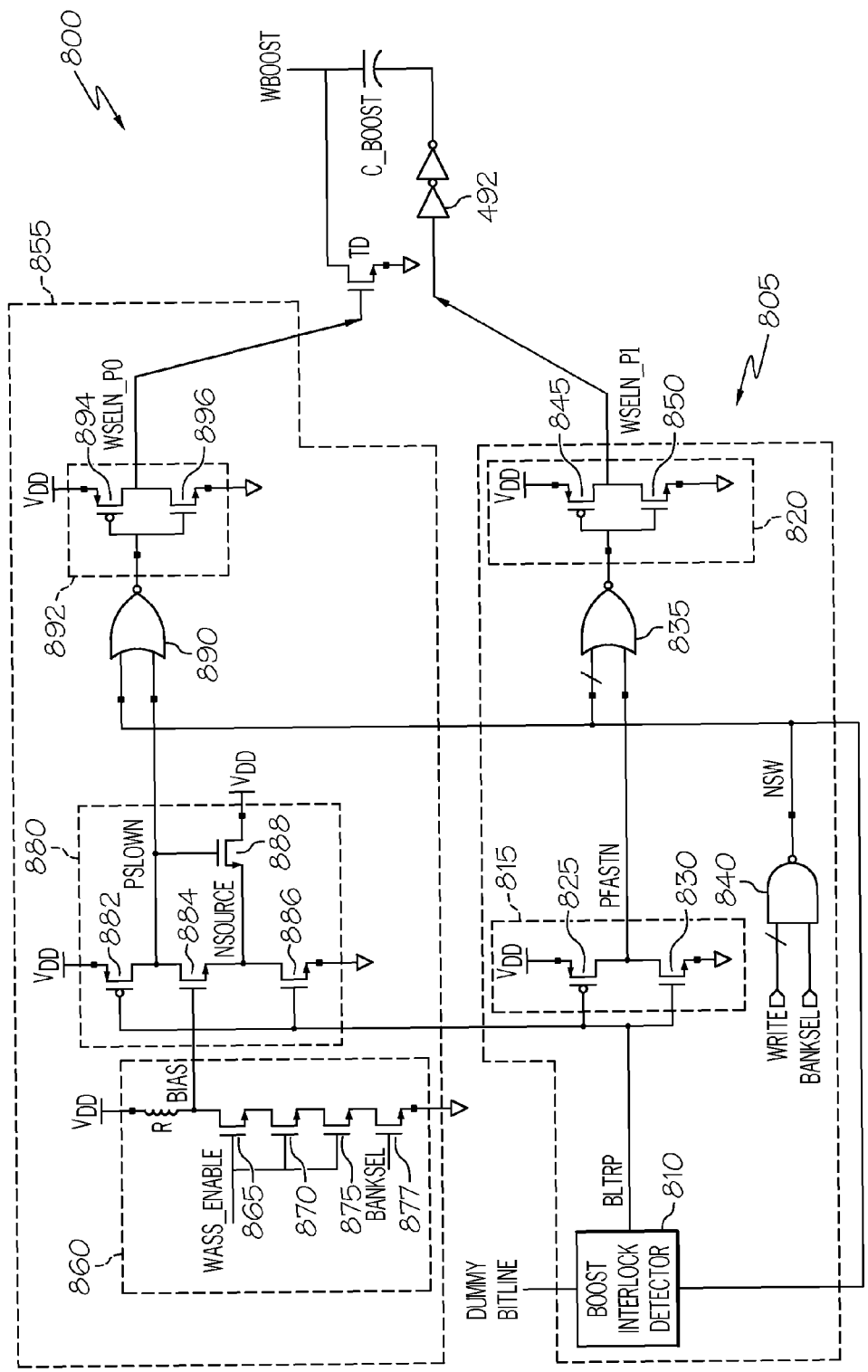
FIG. 8 shows additional circuitry that may be added to the SRAM write assist circuit depicted in FIG. 4 to limit the amount of boost provided at higher supply voltages according to another embodiment of the present invention.

FIG. 8 shows a timing device 800 that may be added to the SRAM write assist circuit 400 depicted in FIG. 4 and described by FIG. 5 to limit the amount of boost provided at higher supply VDD voltages according to another embodiment of the present invention. Like circuitry 700 of FIG. 7, timing device 800 is coupled to discharge device TD and capacitor C_Boost. As a result, other elements associated with SRAM write assist circuit 400 such as bit lines 405, 405', 410 and 410' and bit switches 415 are not illustrated in FIG. 8, however, their operation would be the same as previously described.

The embodiment shown in FIG. 8 addresses the stress that some of the FETs in the SRAM write assist circuit 400 (FIG. 4) experience when operating under high VDD voltages. As used herein, higher VDD voltages are any voltages that are greater than the technology nominal voltage (e.g., 0.9 Volts (V)). As used herein, lower VDD voltages are any voltages that are lower than the technology nominal voltage (e.g., 0.9V). Generally, a lower VDD voltage can range from about 0.7V to about 0.9V, while a higher VDD voltage can range from about 0.9V to about 1.2V.

Higher VDD voltages may occur in SRAM write circuit 400 (FIG. 4) and create stress in the following manner. In some instances, the gates of the FETs in SRAM write circuit 400 (FIG. 4) are at VDD, while their sources go negative due to their coupling to the negative voltage node WBOOST. If VDD is at about 1.1V while the source of one of these FETs goes to −300 millivolts (mV) during a boost below GND, then a 1.4V may arise at the gate-source terminal of the transistors. Over time it has been determined that such voltage levels affect the gate oxide of the transistors causing reliability concerns.

Timing device 800 of FIG. 8 addresses the effects of higher VDD voltages by providing circuitry that change the behavior of the boost. In particular, timing device 800 enables SRAM write assist circuit 400 (FIG. 4) to provide a full boost below GND at lower VDD levels, however, as the VDD levels increase, timing device 800 attenuates or limits the amount of boost. Timing device 800 performs these functions by controlling a timing relationship between the discharge device TD and the capacitor C_BOOST. In particular, timing device 800 enables discharge device TD to shut off prior to initiating the boost provided by capacitor C_BOOST and slow the shutting off of the discharge device TD as the supply voltage VDD increases.

As shown in FIG. 8, timing device comprises a boost control device 805 configured to control the amount of boost provided by capacitor C_BOOST as a function of VDD. Boost control device 805 comprises a boost interlock detector 810 coupled in serial with an inverter 815 and another inverter 820. In one embodiment, boost interlock detector 810 uses a well-known dummy bit line circuit to aid in determining when the boost below GND should be provided by capacitor C_BOOST. As described above, the boost is generally provided after the selected bit line has been discharged to GND. In one embodiment, boost interlock detector 810 comprises three series NFET devices to emulate the discharge characteristics of a bit line during a write cycle. In operation, boost interlock detector 810 drives signal BLTRP high and forwards it to inverter 815, which is formed from PFET 825 and NFET 830. When signal BLTRP goes high, then inverter 815 drives signal PFASTN low.

A NOR gate 835 receives the low PFASTN signal along with signal NSW generated from a NAND gate 840 driven by input signals WRITE and BANKSEL. The WRITE signal is used to initiate the write cycle and the BANKSEL signal is used to activate other elements of timing device 800 as described below. Generally, when a write cycle is initiated, both WRITE signal and BANKSEL signal go high, arming timing device 800. A WRITE signal and BANKSEL signal both at high result in NAND gate 840 driving signal NSW low. With signal PFASTN low and signal NSW low, NOR gate 835 generates a high output which causes inverter 820 (formed from PFET 845 and NFET 850) to drive signal WSELN_P1 low. A low WSELN_P1 passes through inverters 492, which cause capacitor C_BOOST to initiate the boost operation to go below GND.

A discharge device controller 855 is the part of timing device 800 that controls operation of discharge device TD, such that the operational relationship between discharge device TD and capacitor C_BOOST is timed to provide the full boost provided by capacitor C_BOOST to the bit line at lower VDD voltages, while at higher VDD voltages, attenuate the amount of boost. As mentioned before, it is desirable to start the boost after discharge device TD has been turned off by a low WSELN_P0 signal. If discharge device TD does not shut off prior to the boost, then some of the charge from the boost will be go to GND via the discharge device. Because the write margin at higher VDD voltages is adequate, the boost is not needed in these instances. As explained below, discharge device controller 855 keeps signal WSELN_P0 high during the boost in instances where there is a high VDD voltage, in order to have the boost be drained to GND by discharge device TD, rather than be applied to the bit line. In essence, discharge device controller 855 slows signal WSELN_P0 down in relation to signal WSELN_P1 at higher VDD voltages. Because the charge from the boost during the higher VDD voltages is depleted by discharge device TD, the amount of boost to the bit line is attenuated.

FIG. 8 shows that discharge device controller 855 comprises a bias signal generator 860 that generates a BIAS signal that is provided as function of VDD. Bias signal generator 860 comprises a stack of NFETs 865, 870, 875, 877 coupled in series. As shown in FIG. 8, the gates of NFETs 865, 870, 875 are controlled by signal WASS_ENABLE, while the gate of NFET 877 is controlled by signal BANKSEL. Signal WASS_ENABLE is a write assist enable signal that provides the option to shut off the discharge device controller 855. FIG. 8 further shows a resistor R located between voltage supply VDD and the drain of NFET 865. With this configuration, the voltage of BIAS signal is lowered in the presence of a high VDD voltage, whereas the voltage of BIAS signal is kept closer to VDD in the presence of a lower VDD voltage. Having a BIAS signal that is lowered in the presence of a high VDD occurs because the strength of NFETS 865, 870, 875 and 877 is greater at these voltages, resulting in a larger voltage drop across resistor R that puts BIAS signal at a lower voltage. Similarly, a BIAS signal that is close to VDD at lower voltages occurs because the strength of NFETS 865, 870, 875 and 877 is weaker at these voltages, resulting in a negligible voltage drop across resistor R.

As shown in FIG. 8, discharge device controller 855 further comprises a switching stage 880 that is configured to control the timing of the shutting off of the discharge device TD in accordance with the BIAS signal generated from bias signal generator 860. In particular, switching stage 880 slows down the timing of shutting off discharge device TD (i.e., slows the transition of signal WSELN_P0) in the presence of a high VDD voltage. FIG. 8 shows that switching stage 880 comprises a PFET 882 and two NFETs 884 and 886 coupled in series. In particular, the source of PFET 882 is coupled to supply voltage VDD, its drain is coupled to the drain of PFET 884 and its gate is controlled by signal BLTRP. NFET 884 is controlled by the BIAS signal and its source forms a node NSOURCE with the drain of NFET 886 and the source of NFET 888. The gate of NFET 886 is controlled by the BLTRP signal and the drain of NFET 888 is coupled to VDD. A node PSLOW is formed between the drain of PFET 882 and an input of a NOR gate 890.

In operation, when the BLTRP signal goes high, then NFET 884 is impacted because the BIAS voltage is lowered and the voltage at the NSOURCE node is increased. Essentially, because the node PSLOW is at VDD and the node NSOURCE is connected through NFET 888, more time is needed to discharge PSLOW to GND. The end result is that the switching provided by switching stage 880 slows down as VDD increases. This creates the timing relationship necessary to generate a response from NOR gate 890 and an inverter 892 formed from PFET 894 and NFET 896 that keeps the WSELN_P0 signal high during the boost. As mentioned above, this enables the boost at the higher VDD voltages to be attenuated through the discharge device TD.

Figure 9:
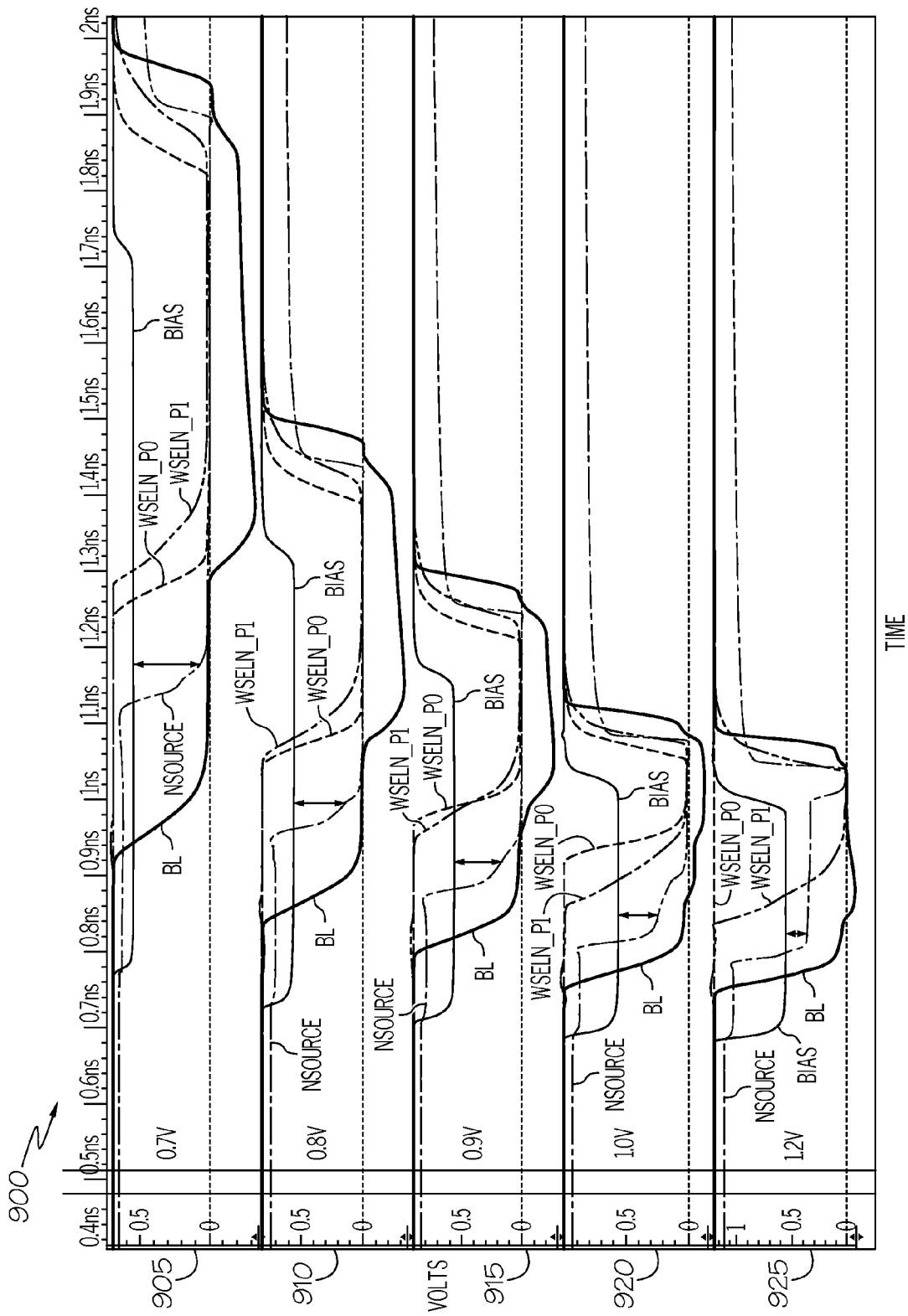
FIG. 9 shows a simulation of bit line discharges using the SRAM write assist circuit depicted in FIG. 8.

FIG. 9 shows a simulation 900 of the discharge of a bit line with the SRAM write assist circuit 400 for higher VDD voltages using the timing device 800 depicted in FIG. 8. In particular, FIG. 9 shows five waveform sets 905, 910, 915, 920 and 925 that respectively illustrate the discharge of a bit line at VDD voltages of 0.7 volts, 0.8 volts, 0.9 volts, 1.0 volts and 1.2 volts. Each waveform set shows the transition of a bit line BL from high to low, and then to the point where it receives a boost below GND (0 volts as indicated on the x-axis of each waveform). FIG. 9 shows that as VDD increases from 0.8 volts (waveform 910) to 0.9 volts (waveform 915), the amount of boost below GND is smaller. When VDD reaches 1.2 volts as shown in waveform set 925, the amount of boost is minimal compared to the amount of boost provide at the other VDD voltages (i.e., 0.7 volts, 0.8 volts, 0.9 volts and 1.0 volts). The reason for this is that timing circuit 800 is controlling the relationship the signals WSELN_P0 and WSELN_P1.

As shown in FIG. 9, at lower VDD voltages (i.e., 0.7 volts and 0.8 volts), signal WSELN_P0 transitions to GND before signal WSELN_P1. This happens because timing circuit 800 is controlling the timing between discharge device TD and capacitor C_BOOST, so that discharge device TD is turned off before the boost is initiated, ensuring no charge leakage. At higher VDD voltages, the relationship between signal WSELN_P0 and signal WSELN_P1 changes causing signal WSELN_P0 to transition after WSELN_P1. In particular, FIG. 9 shows that at a VDD voltage of 0.8 volts, signal WSELN_P0 transitions before signal WSELN_P1. At a VDD voltage of 0.9 volts, signal WSELN_P0 transitions at around the same time as signal WSELN_P1. At a VDD voltage of 1.0 volts, signal WSELN_P1 transitions before signal WSELN_P0 (i.e., the discharge device TD is on and charge from the boost is depleted). At a VDD voltage of 1.2 volts, signal WSELN_P0 does not transition to GND, which keeps discharge device TD on to deplete all the charge from the boost.

FIG. 9 also shows that the bias provided by timing device 800 increases as the VDD voltage is increased from 0.7 volts to 1.2 volts. In particular, FIG. 9 shows that as VDD increases, the BIAS to NSOURCE (gate to source) overdrive is reduced. Note that this amount is illustrated by the arrow in each waveform which points to the difference between BIAS and NSOURCE. This is the amount that contributes to the delay of the transition of the signal WSELN_P0 from high to GND.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A device, comprising:
   a memory array comprising a plurality of static random access memory (SRAM) cells arranged in rows and columns, a plurality of true bit lines each connected to a column of the memory array and a plurality of complement bit lines each forming a differential pair with, and in the same column as one of the plurality of true bit lines; and
   a write assist circuit connected to each of the differential pair of bit lines in each of the plurality of SRAM cells of the memory array, the write assist circuit comprising:
      a negative boost node;
      a discharge device coupled to ground and the negative boost node, the discharge device configured to receive a first control signal;
      a boost capacitor coupled to the negative boost node, the boost capacitor configured to receive a second control signal;
      a plurality of bit line control devices configured to control a write data line for writing a bit line in a write cycle, each of the plurality of bit line control devices comprising a transistor coupled to the negative boost node, wherein a gate-source terminal of each transistor of the plurality of bit line control devices is connected to the negative boost node; and
      a bit line control selection device coupled to the plurality of bit line control devices and the negative boost node, the bit line control selection device configured to select one of the plurality of bit line control devices during the write cycle, wherein all of a charge on the negative boost node is directed to only the selected one of the plurality of bit line control devices, wherein the gate-source terminals of each of the transistors of the unselected plurality of bit line control devices are shorted to receive negative voltage from the negative boost node, feeding the negative voltage to the gate, preventing the charge on the negative boost node from taking a path to the unselected plurality of bit line control devices and causing activation thereof.

2. The circuit according to claim 1, wherein the bit line control selection device comprises a plurality of bit control selection devices, each of the plurality of bit control selection devices coupled to one of the plurality of bit line control devices.

3. The circuit according to claim 1, wherein the boost capacitor is charged during a pre-charge phase of the write cycle in accordance with the second control signal.

4. The circuit according to claim 1, wherein the discharge device pulls the write data line of the selected bit control device to ground in an active phase of the write cycle.

5. The circuit according to claim 4, wherein the write data line of the selected bit control device is boosted below ground by the boost capacitor.

6. The circuit according to claim 5, wherein the boost below ground of the write data line of the selected bit control device provided by the boost capacitor is initiated in response to shutting off the discharge device.

7. The circuit according to claim 6, wherein control of the discharge device by the first control signal is separate and independent from control of the boost capacitor by the second control signal.

8. The circuit according to claim 1, further comprising a leakage suppression device coupled to the discharge device, wherein the leakage suppression device is configured to receive the negative voltage from the negative boost node during a boost below ground by the boost capacitor and feed the negative voltage to a gate of the discharge device to minimize leakage.

9. The circuit according to claim 8, further comprising a first logic device coupled to the boost capacitor, wherein the first logic device is configured to block charging of the boost capacitor for unselected write drivers.

10. The circuit according to claim 9, wherein control of the discharge device by the first control signal and control of the boost capacitor by the second control signal are logically connected to separately control timing of the shutting off of the discharge device without having the shut-off of the discharge device charge the boost capacitor.

11. The circuit according to claim 1, further comprising a timing device coupled to the discharge device and the boost capacitor, wherein the timing device is configured to control a timing relationship between the discharge device and the boost capacitor, wherein the timing device enables the discharge device to shut off prior to initiating a boost below ground provided by the boost capacitor and slow the shutting off of the discharge device as a supply voltage increases in order to attenuate the amount of boost.

12. The circuit according to claim 11, wherein the timing device comprises a boost control device configured to control the amount of boost provided by the boost capacitor as a function of the supply voltage.

13. The circuit according to claim 12, wherein the boost control device comprises a boost interlock detector coupled in serial with a first inverter and a second inverter.

14. The circuit according to claim 13, wherein the boost control device further comprises a first logic gate located between the first inverter and the second inverter.

15. The circuit according to claim 11, wherein the timing device comprises a discharge device controller configured to control operation of the discharge device.

16. The circuit according to claim 15, wherein the discharge device controller comprises a bias signal generator coupled in serial to a switching stage, wherein the bias signal generator is configured to provide a bias signal as a function of the supply voltage, wherein the switching stage is configured to control the timing of the shutting off of the discharge device in accordance with the bias signal, and wherein the switching stage slows down a transition of the first control signal in response to an increase in the supply voltage.

17. A static random access memory (SRAM) write assist circuit, comprising:
   a negative boost node;

a discharge device coupled to ground and the negative boost node, the discharge device configured to receive a first control signal;

a boost capacitor coupled to the negative boost node, the boost capacitor configured to receive a second control signal;

a plurality of bit line control devices configured to control a write data line for writing a bit line in a write cycle, each of the plurality of bit line control devices comprising a transistor coupled to the negative boost node, wherein a gate-source terminal of each transistor of the plurality of bit line control devices is connected to the negative boost node; and a bit line control selection device coupled to the plurality of bit line control devices and the negative boost node, the bit line control selection device configured to select one of the plurality of bit line control devices during the write cycle, wherein all of a charge on the negative boost node is directed to only the selected one of the plurality of bit line control devices, wherein the gate-source terminals of each of the transistors of the unselected plurality of bit line control devices are shorted to receive negative voltage from the negative boost node, feeding the negative voltage to the gate, preventing the charge on the negative boost node from taking a path to the unselected plurality of bit line control devices and causing activation thereof.

18. The SRAM write assist circuit according to claim 17, wherein control of the discharge device via the first control signal is separate and independent from control of the boost capacitor via the second control signal.

19. The SRAM write assist circuit according to claim 17, wherein control of the discharge device via the first control signal and control of the boost capacitor via the second control signal are logically connected to separately control timing of the shutting off of the discharge device without having the shut-off of the discharge device charge the boost capacitor.

20. The SRAM write assist circuit according to claim 17, further comprising a timing device coupled to the discharge device and the boost capacitor, wherein the timing device is configured to control a timing relationship between the discharge device and the boost capacitor, wherein the timing device enables the discharge device to shut off prior to initiating the boost provided by the boost capacitor and slow the shutting off of the discharge device as a supply voltage increases in order to attenuate the amount of boost provided by the boost capacitor.

* * * * *